United States Patent [19]

Wenz et al.

[11] Patent Number: 5,085,939
[45] Date of Patent: Feb. 4, 1992

[54] THIN FILM-COATED POLYMER WEBS

[75] Inventors: Robert P. Wenz, Cottage Grove; Michael F. Weber, Shoreview; Ravindra L. Arudi, Woodbury, all of Minn.

[73] Assignee: Minnesota Mining and Manufacturing Company, St. Paul, Minn.

[21] Appl. No.: 602,792

[22] Filed: Oct. 24, 1990

[51] Int. Cl.$^5$ .................. B32B 9/04; B23K 15/00; B44C 1/22; B29C 37/00
[52] U.S. Cl. .................. 428/411.1; 156/643; 156/668; 427/44; 427/307; 428/421; 428/448; 428/458; 428/473.5
[58] Field of Search ............... 156/643, 646, 654, 668; 264/22; 219/121.17, 121.2, 121.33; 428/411.1, 421, 448, 450, 458, 473.5; 204/157.15, 192.1, 192.11, 192.12, 192.25, 192.29; 427/44, 74, 307

[56] References Cited
U.S. PATENT DOCUMENTS

| | | | |
|---|---|---|---|
| 3,436,468 | 4/1969 | Haberecht | 174/68.5 |
| 4,533,566 | 8/1985 | Evans et al. | 427/44 |
| 4,543,268 | 9/1985 | Sidney et al. | 427/44 |
| 4,594,262 | 6/1986 | Kreil et al. | 427/44 |
| 4,808,352 | 2/1989 | Bhateja et al. | 264/22 |
| 4,822,451 | 4/1989 | Ouderkirk et al. | 156/643 |
| 4,879,176 | 11/1989 | Ouderkirk et al. | 428/323 |
| 4,902,378 | 2/1990 | Ouderkirk et al. | 156/643 |

OTHER PUBLICATIONS

Egusa, Journal of Materials Science, vol. 23, No. 8, pp. 2753-2760 (Aug. 1988).
Krishnaswamy et al., SPIE-Int'l Society of Optical Engineering, vol. 773, pp. 159-164 (1987).
Basheer et al., Radiation Phys. Chem., vol. 25, Nos. 1-3, pp. 389-398 (1985).
Ferl et al., Proceedings of the IEEE Transactions (of) Nuclear Science, vol. NS-28, No. 6, pp. 4119-4124 (Dec. 1981).
Clark, Editor, The Encyclopedia of x-Rays and Gamma Rays, pp. 768-772 (1963).

Primary Examiner—William A. Powell
Attorney, Agent, or Firm—Gary L. Griswold; Walter N. Kirn; David B. Kagan

[57] ABSTRACT

The present invention relates to thin film-coated polymer webs, and more particularly to thin film electronic devices supported upon a polymer web, wherein the polymer web is treated with a purifying amount of electron beam radiation.

28 Claims, 1 Drawing Sheet

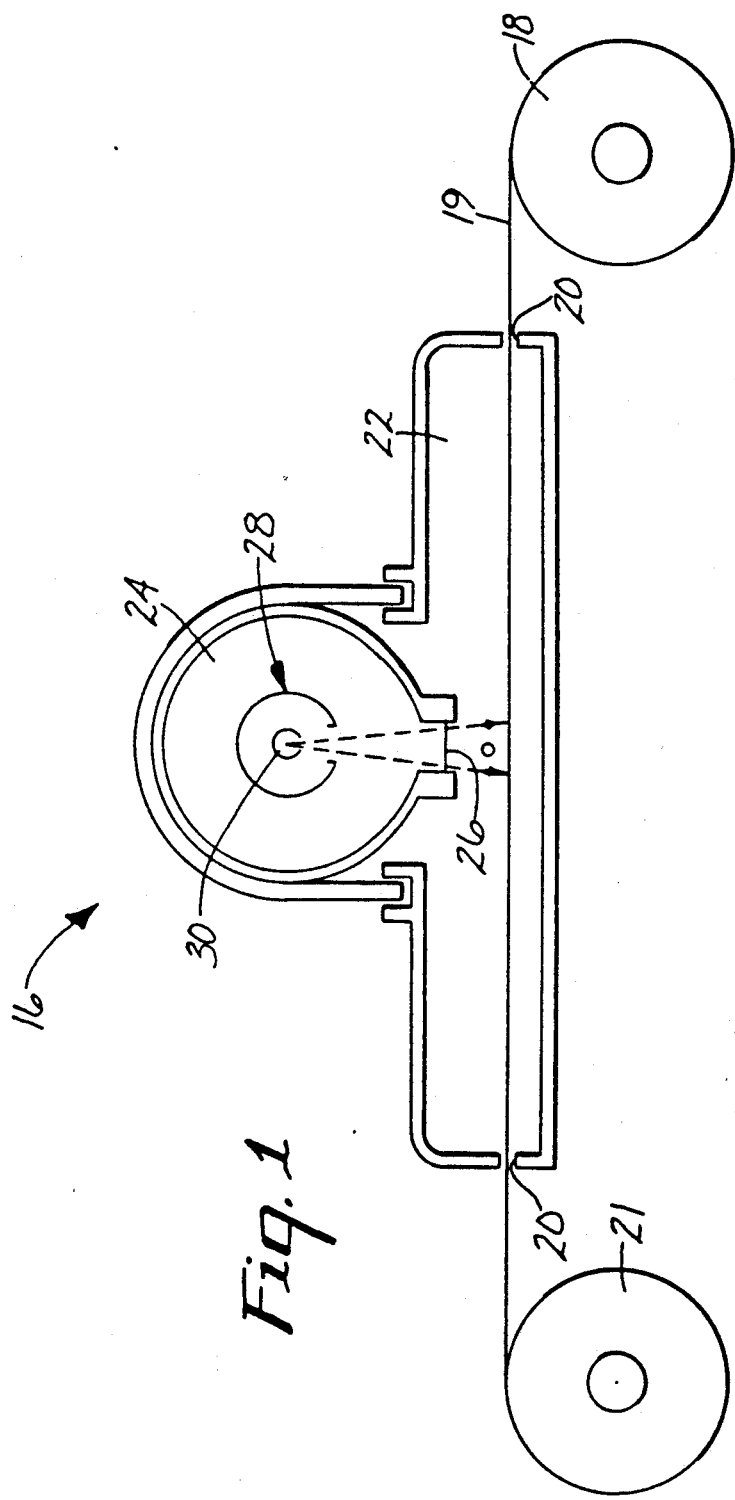
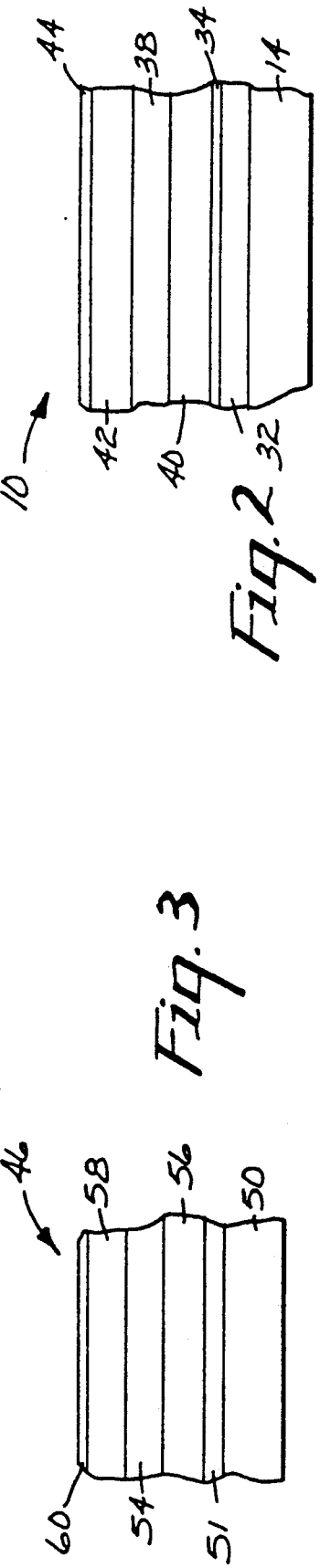

THIN FILM-COATED POLYMER WEBS

The Government of the United States of America has rights in this invention pursuant to Subcontract ZB-4-03056-2 awarded by the United States Department of Energy.

FIELD OF THE INVENTION

The present invention relates to thin film-coated polymer webs, and more particularly to thin film electronic devices supported upon a polymer web, wherein the polymer web is treated with a purifying amount of electron beam radiation.

BACKGROUND OF THE INVENTION

Thin film-coated polymer webs are utilized in many applications requiring conductive, semiconductive, insulating, or reflective coatings and are particularly useful for making thin film electronic devices such as thin film photovoltaic devices. A major concern with thin film-coated polymer webs is the purity of the polymer web. It is important that the polymer web b ®substantially free of contaminants. If not removed from the polymer web, the contaminants can impair the performance of the thin film electronic devices which are formed on the polymer web. Thin film photovoltaic devices, in particular, are especially susceptible to the presence of contaminants in the polymer web.

Perhaps the most popular method of purifying the polymer web is the thermal outgassing method. In this method, the polymer web is heated in a vacuum at a temperature approaching the thermal limits of the polymer web.

U.S. Pat. No. 3,436,468 teaches that the exposure of portions of an inorganic polymer to electron beam radiation decreases the electrical resistance of the exposed portion. This change in resistance allows electroless plating of metal to those areas exposed.

Equsa, in a paper published by the Journal of Material Science, vol. 23, no. 8, pp. 2753-2760 (August (1988), describes changes in the properties of a polymer matrix, such as Young's modulus and ultimate strength, as a function of radiation exposure.

Krishnaswamy et al., SPIE-International Society of Optical Engineering, vol. 773, pp. 159-164 (1987), describes the direct patterning of polyimide coated on a silicon wafer using a grid line on an electron microscope as a mask. The polyimide is cross-linked as a consequence of exposure to electron beam radiation, thus providing an etch mask for patterning onto the polyimide.

Ferl et al., Proceedings of the IEEE Transactrons (of) Nuclear Science, vol. NS-28, no. 6, pp. 4119-4124 (December 1981) describes the effects of simulated space radiation on polyimide.

SUMMARY OF THE INVENTION

The present invention concerns improved, thin film-coated polymer webs. We have now found that conventional methods for purifying polymer webs, such as the thermal outgassing method, leaves many contaminants in the polymer web. Our investigations have shown that this allows the contaminants to co-deposit into the various conductive, semiconductive, insulating, and reflective layers that are deposited onto the polymer web. This can result in a substantial number of poorly performing, or even inoperative, thin film devices.

It has now been discovered, however, that treating the polymer web with megarad amounts of electron beam radiation of the proper energy provides a polymer web with a greater degree of purity than can be achieved with conventional methods. It has also been discovered that thin film photovoltaic devices prepared from the electron-beam purified polymer webs of the present invention show greater and more uniform output in terms of fill factor characteristics and device yield.

The advantages of the present invention are achieved by a thin film-coated polymer web which has been treated with an amount of electron beam radiation sufficient to reduce the amount of low mass residual contaminants from the surface and body of the polymer web. In preferred embodiments of the present invention, the polymer web is a polyimide material which is treated with from 5 to 40 Mrads of electron beam radiation having an energy of from about 150 keV to about 175 keV to achieve this purifying effect.

BRIEF DESCRIPTION OF THE DRAWINGS

FIG. 1 is a schematic view of an apparatus useful for providing the electron beam treatment of the present invention.

FIG. 2 is a side sectional view of a thin film-coated polymer web of the present invention.

FIG. 3 is an alternative embodiment of a thin film-coated polymer web of the present invention.

DETAILED DESCRIPTION OF THE INVENTION

Referring first to FIG. 2, there is shown a preferred embodiment of the present invention. A thin film-coated polymer web 10 contains a polymer web 14. Examples of polymer web materials suitable for use in the present invention would include polyester, fluorinated polyester, polyvinyl fluoride, polyvinylidene fluoride, polysulphone, aramid, and polytetrafluoroethylene. A preferred polymer web material is a thermosetting polyimide such as Novax brand polyimide, Grade ML252, available from Mitsubishi Chemical Industries, Ltd. Polyimide is a preferred polymer web material because polyimide is generally characterized by excellent thermal properties, chemical resistance, and dimensional stability.

The thickness of the polymer web 14 may vary over a considerable range, depending on the application and the environment. For example, where flexibility is required, the web 14 should be relatively thin. In the case of a thin film, amorphous silicon, photovoltaic device, polymer webs having a thickness of from about 10 micrometers to a few hundred micrometers would be suitable.

The polymer web 14 is treated with a purifying amount of electron beam radiation in order to reduce the amount of low mass, residual contaminants from the surface and body of the polymer web 14. A suitable amount of electron beam radiation sufficient to purify a particular polymer web material may be determined as follows. First, samples of the polymer web material are obtained. Then, using electron beam radiation having an energy of from about 100 keV to about 400 keV, preferably from about 150 keV to about 250 keV, and more preferably from about 150 keV to about 175 keV, all but one of the samples are treated with incrementally increasing dosages of electron beam radiation. Increments of about 1 Mrad are suitable. The outgassing characteristics of each sample are then determined by using, for example, a gas chromatograph instrument. A purifying effect is observed as a reduction in the amount of outgassing components detected by the gas chromatograph instrument for the treated samples relative to the untreated sample. The optimum dosage rate is the lesser amount of either (a) that amount of electron beam radiation for which an additional amount of electron beam radiation provides substantially no additional purification as compared to lower dosages, or (b) that amount of electron beam radiation for which an additional amount of electron beam radiation results in the physical degradation of the polymer web material.

For polyimide, from 5 to 40, preferably from 20 to 40, and more preferably about 40 Mrads of electron beam radiation has been found to be effective. Below about 5 Mrads, the purifying treatment is only marginally effective. Above about 40 Mrads, little additional purification would be achieved compared to lower dosages. Such higher dosages also involve the additional risk of degrading the physical properties of the polymer web 14.

The electron beam treatment of the polymer web 4 can take place under ambient conditions or in an inert atmosphere. Even so, it is preferred to use an inert atmosphere as a safety measure in order to keep ozone levels to a minimum. Inert atmosphere means an environment comprising flue gas, nitrogen, or a noble gas and containing no more oxygen than 500 parts per million. A preferred inert atmosphere is a nitrogen atmosphere having an oxygen content of less than 60 parts per million.

The specific source of electron beam radiation utilized in practicing the invention is not critical. As one example, FIG. 1 shows a schematic representation of one apparatus 16 that has been found to be useful for treating a polymer web with electron beam radiation. The apparatus 16 is a 175 keV machine capable of processing webs up to 15 centimeters in width and is available under the trade name Electrocurtain from Energy Sciences Inc., Woburn, Mass.

As seen in FIG. 1, a polymer web material 19 is transported through narrow slits 20 of a chamber 22 from a supply roll 18 to a take-up roll 21. Nitrogen may be pumped into the chamber 22 to provide an inert atmosphere having an oxygen content of less than 60 parts per million. The slits 20 also function as exhausts for the nitrogen being pumped into the chamber 22. A vacuum chamber 24 is mounted over a metallic foil window 26 of the chamber 22. The foil window 26 is made of titanium. The vacuum chamber 24 contains a linear filament electron source 28 comprising a series of small, parallel filaments 30, one of which is shown. In the vacuum chamber 24, the electron beam is generated in a vacuum of $10^{-7}$ Torr. After being irradiated through the foil window 26, the polymer web material 19 is wound upon itself on the take-up roll 21.

Using the apparatus 16 shown in FIG. 1, the amount of radiation received by the polymer web material 19 is given approximately by the following expression:

$$D = (30 \times I)/S$$

where D is the dosage in Mrads (megarads), I is the beam current in milliamps, and S is the speed of the web material 19 in centimeters per second. As seen from this expression, the amount of radiation received by the polymer web material 19 can be controlled by varying the speed of the material 19 as it moves past the foil window 26. The amount of radiation received by the material 19 can also be controlled by varying the beam current of the electron source 28.

Referring again to FIG. 2, treatment of the polymer web 14 with electron beam radiation reduces the amount of contaminants in the surface and body of the web 14 to a much greater extent than can be achieved with conventional thermal outgassing treatments. While not wishing to be bound by a particular theory, a possible rationale for this advantage can be suggested. In the case of a web material such as polyimide, for example, the polyimide is formed in a two-step condensation reaction. The reaction is generally described in Allcock and Lampe, *Contemporary Polymer Chemistry*, pp. 36-37 (1981). Even if this two-step reaction were to go to 99.9% completion, the remaining 0.1% unreacted materials would be present in the surface and body of the polyimide as low mass, residual contaminants. These contaminants include left-over reactants, prepolymer, solvent, water, and the like. Not only polyimide, but also other polymeric materials would also contain such contaminants. In the process of depositing a thin film electronic device onto the polymer web, these contaminants would tend to migrate from the web into the various thin film materials deposited onto the web. This contamination may result in a substantial number of poorly performing, or even inoperative, devices. Thin film photovoltaic devices, in particular, are susceptible to the damaging effects of these contaminants.

Until now, this problem was approached by using thermal outgassing techniques in an attempt to drive off the low mass, residual contaminants. Thermal outgassing is typically accomplished in a vacuum of 200 millitorr, or less, and at a temperature approaching the thermal limits of the polymer web material, e.g., about 350° C. for polyimide. This approach has been only marginally effective. Thermal outgassing may drive off some of the water and solvent, but fails to sufficiently eliminate the substantial amount of remaining contaminants. Thermal outgassing also fails to achieve any further cross-linking of the polymer web material.

The electron beam treatment according to the present invention overcomes these shortcomings associated with conventional thermal outgassing techniques. Upon treatment of the polymer web 14 with electron beam radiation, it is believed that the low mass, residual contaminants in the web are caused to react and become bound up in the polymeric structure. Polyimide in particular has several reactive sites along the polymer chain for such interactions. As a result, the amount of contaminants which can migrate from the polymer web and damage thin film electronic devices deposited upon the web 14 is greatly reduced.

As further shown in FIG. 2, a thin film electronic device comprising layers 32, 34, 38, 40, 42, and 44 is deposited onto the electron beam purified polymer web 14. In the practice of the invention, any thin film electronic device may be advantageously deposited onto the electron beam purified polymer web 14. For purposes of illustration a thin film, amorphous silicon, photovoltaic semiconductor device is shown in FIG. 2.

An electrically conductive, bottom layer 32 is sputter deposited onto the polymer web 14 to form a metallized polymer. The electrically conductive bottom layer 32 is preferably aluminum, but may also be various other metals, such as copper, chromium, alloys thereof, stainless steel, and the like. Aluminum is a more preferred material for the electrically conductive bottom layer 32, because aluminum exhibits excellent adhesion, reflectivity, and conductivity properties.

A diffusion barrier 34 is optionally deposited onto the electrically conductive bottom layer 32. The diffusion barrier 34 is used to prevent aluminum ions, silver ions, and the like from diffusing from the electrically conductive bottom layer 32 into the semiconducting layers 38, 40, and 42 subsequently deposited over the polymer web 14. Suitable materials for the diffusion barrier 34 include stainless steel, refractory metals, titanium nitride, and the like. It is to be understood that the diffusion barrier 34 is not required when the electrically conductive bottom layer 32 is made from a material which does not tend to diffuse into the semiconducting layers 38, 40, and 42.

A photovoltaic structure, generally comprising a semiconducting layer 38 interposed between doped semiconducting layers 40 and 42, is deposited onto the diffusion barrier 34. The various semiconducting layers 38, 40, and 42 may comprise any of the known photovoltaic semiconducting materials of either the organic or inorganic type, or mixtures thereof, in either continuous web form or particulate binder form. Particularly useful materials are amorphous materials which contain at least one of silicon or germanium atoms as a matrix and which contain at least one of hydrogen (H) or halogen (X) atoms. Such materials include hydrogenated amorphous silicon (a-Si:H), halogenated amorphous silicon (a-Si:X), hydrogenated amorphous germanium (a-Ge:H), halogenated amorphous germanium (a-Ge:X), as well as corresponding silicon-germanium alloys of the above materials. Germanium may be useful in preparing materials that are sensitive to the near infrared region of the visible spectrum.

A semiconducting material which has been found to be particularly useful in the practice of the present invention is hydrogenated amorphous silicon (a-Si:H). This type of material is described in U.S. Pat. Nos. 4,377,628; 4,365,015; 4,365,013; 4,297,392; and 4,265,991. Hydrogen is present in such materials as H bonded to Si or ionized and weakly bound to Si or as interstitial H, The hydrogen content may vary, as is known to those skilled in the art, between about 5 and 40 atomic percent in order to obtain desired photovoltaic properties. A preferred method for making such materials is by RF glow discharge of silane. However, other well known techniques such as sputtering and chemical vapor deposition may also be used advantageously.

The doped semiconducting layers 40 and 42 comprise p-type and n-type semiconductive materials. In one embodiment, the photovoltaic structure may be a p-i-n structure. That is, the doped layer 40 comprises a p-type semiconducting material; semiconducting layer 38 comprises an undoped semiconducting material; and the doped layer 42 comprises an n-type semiconducting material. In another embodiment, the photovoltaic structure may be an n-i-p structure. That is, the doped layer 40 comprises an n-type semiconducting material; the semiconducting layer 38 comprises an undoped semiconducting material; and the doped layer 42 comprises a p-type semiconducting material. The doped layers 40 and 42 are prepared according to methods well known in the art. For example, U.S. Pat. No. 4,513,073 generally describes a method of preparing p-type and n-type doped amorphous silicon.

Typically, the semiconducting layers 38, 40, and 42 have a combined thickness of from 0.1 to 10 micrometers, and preferably from 0.1 to 0.5 micrometers. These thin layers resist cracking and peeling, a characteristic which is essential for use on flexible polymer webs. The preferred thickness may be different for other materials and applications.

An electrically conductive, transparent or semi-transparent top layer 44 is deposited onto the photovoltaic structure. Suitable materials for the top layer 44 include the various transparent or semi-transparent, conducting oxides such as indium tin oxide, tin oxide, indium oxide, and zinc oxide.

An alternate structure 46 of the present invention is shown in FIG. 3. There, a thin film electronic device comprising layers 51, 54, 56, 58, and 60, is deposited onto an electron beam purified polymer web 50. In this embodiment, the polymer web 50 is a transparent or semi-transparent polymer material. A transparent or semi-transparent electrode layer 51, prepared from a suitable transparent or semi-transparent oxide, is deposited onto the polymer web 50. A photovoltaic structure comprising semiconducting layer 54 interposed between doped semiconducting layers 56 and 58 is deposited onto the electrode 51. The semiconducting layers 54, 56, and 58 may form a p-i-n photovoltaic structure wherein the doped layer 56 is a p-type semiconducting material; the semiconducting layer 54 is undoped; and the doped layer 58 is an n-type semiconducting material. Alternatively, the semiconducting layers 54, 56, and 58 may form an n-i-p photovoltaic structure wherein the doped layer 56 is an n-type semiconducting material; the semiconducting layer 54 is undoped; and the doped layer 58 is a p-type semiconducting material. An electrically conductive layer 60 is deposited onto the photovoltaic structure 52. A diffusion barrier (not shown) optionally may be interposed between the doped semiconducting layer 58 and the electrically conductive layer 60, if required. The composition and the physical characteristics of each of the layers 50, 51, 54, 56, 58, and 60 is the same as the corresponding layers described above with reference to FIG. 2.

The invention will be further described by reference to the following examples.

EXAMPLE 1

In this experiment, the outgassing characteristics of three samples of polyimide were compared. Using the apparatus of FIG. 1, two of the samples were treated with 20 and 40 Mrads of electron beam radiation, respectively. The outgassing characteristics of all three samples were determined using a gas chromatography/mass spectrometry instrument ("GC"). The GC was fitted with a 183 cm, OV-01, stainless steel column filled with methyl silicon gel. The heated sample head space method was used.

Each sample was cut into thin slices and sealed in a 75 ml glass capillary tube fitted with a stopcock valve. The tube was immersed in liquid nitrogen, and the air in the tube was evacuated with a roughing pump for 3 minutes. The sample was then heated at 300° C. for 20 minutes. The outgassing components were separated in the column and then recorded by a mass spectrometer. For each sample, four types of outgassing components were detected: water, trace aliphatic hydrocarbons, trace methanol, and trace aromatic (e.g., toluene) compounds. The relative amounts of each component corresponded to the relative area under the curve plotted by the mass spectrometer.

The relative amounts of outgassing components were as follows:

Water:
20 Mrad sample > thermal sample > 40 Mrad sample.
Trace aliphatic hydrocarbons:
thermal sample = 20 Mrad sample > 40 Mrad sample.
Trace methanol:
thermal sample > 20 Mrad sample > 40 Mrad sample.
Trace aromatic compounds:
thermal sample = 20 Mrad sample > 40 Mrad sample.

As seen from these results, the 40 Mrad sample showed less outgassed components than either of the other two samples. As compared to the thermal sample in particular, the 40 Mrad sample showed about 5 times less outgassed components across the entire mass spectrum.

Generally, the 20 Mrad sample showed improved reduction in the amount of outgassed trace methanol compared with the thermal sample. The thermal sample did show less outgassed water than the 20 Mrad sample, but it is believed that the additional curing provided by the electron beam treatment, which tends to release water, may explain this.

EXAMPLE 2

In this experiment, the outgassing characteristics of three samples of polyimide were compared. All three samples were subjected to a thermal outgassing treatment at 300° C. in an oven for 2 minutes. Additionally, using the apparatus of FIG. 1, two of the samples were subsequently treated with 20 and 40 Mrads of electron beam radiation, respectively. The outgassing characteristics of all three samples were determined using mass spectrometry.

Each sample was cut into strips and placed in a glass capillary tube. The tube was mounted in the direct insertion probe in the source of a mass spectrometry instrument. The probe was heated from 30° C. to 300° C. at 15° C./min. The temperature was held at 300° C. for 5 minutes, after which the probe cooled to 180° C. The probe was reheated to 300° C. in about 1 minute and then further heated to 350° C. at 10° C./min. The volatile components were subjected to electron bombardment, and full scan spectra from masses 29 to 600 were recorded. The results were as follows:

TABLE I*

|  | Thermal Only Sample | Thermal and 20 Mrad e-beam Sample | Thermal and 40 Mrad e-beam Sample |
| --- | --- | --- | --- |
| $CO_2$ | 73 | 13 | 10 |
| $C_9H_7N$ | 52 | 31 | 17 |
| Relative Area For All Ions Detected | 64 | 19 | 14 |

*All amounts are expressed in terms of the relative area plotted by the mass spectrometer for each outgassing component.

These results show that the samples treated with electron beam radiation outgassed a lesser amount of volatile components than the sample receiving no electron beam treatment.

EXAMPLE 3

Using the electron beam apparatus described above with reference to FIG. 1, different segments of a 2 mil thick by 100 mm wide polyimide web (Novax brand, grade ML 252, available from Mitsubishi Chemical Industries, Ltd.) were treated with 0, 5, 10, 15, 20, and 40 Mrads of electron beam radiation, respectively. Web speed was set at 5 cm/s. The dosage was controlled by varying the electron beam current. Following the electron beam treatment, the web was transported at 1 cm/sec through a 10 cm heated zone maintained at a temperature of 300° C. and a vacuum of $10^{-6}$ Torr. Next, a layer of aluminum was deposited onto one side of the web by sputtering from a DC magnetron cathode to thereby form a metallized polymer. During the aluminum sputtering step, the web sputtering chamber was held at a temperature of about 200° C. in a vacuum of about 30 millitorr. The DC magnetron was operated at 375 volts and 400 watts. The polyimide web traveled at a speed of about 5 cm/min. The thickness of the deposited aluminum layer was about 2000 angstroms. After depositing the aluminum, a titanium nitride diffusion barrier was deposited onto the aluminum layer using the same sputtering procedure. The diffusion barrier was 100 angstroms thick.

Web samples were then taken from the coated polymer web corresponding to electron beam dosages of 0, 5, 10, 15, 20, and 40 Mrads, respectively. Each of the samples was placed into a deposition chamber where a p-i-n photovoltaic structure having a total thickness of about 5000 angstroms was deposited onto the sample. The structure comprised a first layer of n-type hydrogenated amorphous silicon, a second layer of intrinsic-type hydrogenated amorphous silicon, and a third layer of p-type hydrogenated amorphous silicon. After this, the sample was adhesively mounted onto an aluminum plate for ease in handling. Each of the samples was approximately 37 mm wide and 108 mm long. Following the deposition of the amorphous silicon layers, a pattern of chromium dots was deposited onto the sample to form a top electrode layer. The pattern comprised a 6×6 rectangular array of dots that were 100 angstroms thick and 2.5 mm in diameter, and a 2×4 rectangular array of dots that were 3.3 mm in diameter and 100 angstroms thick. Each chromium dot corresponded to an individual photovoltaic cell A layer of conductive epoxy was deposited over regions of the diffusion barrier which were not covered by the hydrogenated silicon layers.

EXAMPLE 4

An experiment was performed in order to show the improvement in the fill factor characteristics of the present invention. Fill factor values were determined by exposing each of the samples prepared in Example 3 to a standard amount of simulated solar radiation. The current output of the sample was measured as a function of the opposing voltage applied to the bottom contact layer, i.e., the aluminum layer, and a top chromium dot. The fill factor of a sample was calculated using the expression $P_{max}/P_o$, where:

(1) $P_{max}$ = (current) × (voltage) at the maximum power output; and (2) P = (short circuit current) × (open circuit voltage). Several fill factors for each sample were determined by taking measurements from chromium dots on each sample. For statistical analysis, the chromium dots were divided into two groups: those near the edge of the web and those near the center of the web. This was done because the experimental equipment used in making the samples caused the a-Si to be thinner near the edge than in the center. Photovoltaic cells having thinner a-Si layers generally have higher fill factors, because such thinner layers tend to have a higher internal electric field strength (Volts/cm) than thicker layers. However, the fill factors measured near the center of the web are more representative of the bulk of the sample cells produced and, therefore, provide the more important data. The results of this experiment are shown in Table I.

TABLE II

| Sample | Location of Chromium Dots | Electron Beam Dosage (Mrads) | Average Fill Factor | Standard Deviation |
| --- | --- | --- | --- | --- |
| 1 | edge | 0 | 0.59 | 0.04 |
| 2 | edge | 5 | 0.66 | —* |
| 3 | edge | 10 | 0.65 | 0.04 |
| 4 | edge | 20 | 0.66 | 0.01 |
| 5 | edge | 40 | 0.65 | 0.01 |
| 1 | center | 0 | 0.58 | 0.05 |
| 2 | center | 5 | 0.64 | 0.01 |
| 3 | center | 10 | 0.60 | 0.05 |
| 4 | center | 20 | 0.65 | 0.01 |
| 5 | center | 40 | 0.66 | 0.01 |

*Only one cell was tested for Sample 2 near the edge of the polymer web; thus, a standard deviation for the corresponding fill factor was not calculated.

Improvement in fill factors for those samples produced on electron beam treated web is clearly shown in the data presented in Table II. The data show that the average fill factor was about 14% higher for samples containing polyimide web material treated with electron beam radiation as compared to samples containing untreated polyimide. The data also show that the variation in fill factor, as shown by the standard deviation, was much greater for samples containing untreated polyimide than for samples containing polyimide treated with 20 and 40 Mrads of electron beam radiation.

EXAMPLE 5

A number of experiments were performed in order to show the improvement in device yield of the present invention. Device yield refers to the percentage of chromium dots on the samples prepared in Example 3 which maintain substantially full voltage up to about the short circuit current. In some of the experiments, embodiments of the present invention showed significantly improved device yield. In these particular experiments, the samples produced on the web treated with 10 Mrads or more of electron beam radiation showed a device yield of about 90 percent to nearly 100 percent at open circuit voltage of 0.8 volts or more. In comparison, samples produced on untreated web typically showed device yields of from 60 percent to 70 percent at the same voltage, and some of the untreated samples even showed device yields as low as 10 percent to 30 percent.

Other embodiments of this invention will be apparent to those skilled in the art from a consideration of this specification or from practice of the invention disclosed herein. Various omissions, modifications, and changes to the principles described herein may be made by one skilled in the art without departing from the true scope and spirit of the invention which is indicated by the following claims.

What is claimed is:

1. A thin film-coated polymer web, comprising:
   a) a polymer web, wherein the polymer web has been purified with an amount of electron beam radiation sufficient to reduce the amount of low mass residual contaminants that outgas from the surface and body of the polymer web;
   b) a thin film electronic device deposited onto the polymer web.

2. The thin film-coated polymer web of claim 1, wherein the polymer web is a flexible polymeric material selected from the group consisting of polyimide, polyester, fluorinated polyester, polyvinyl fluoride, polyvinylidene fluoride, polysulphone, aramid, and polytetrafluoroethylene.

3. The thin film-coated polymer web of claim 1, wherein the polymer web is a flexible polyimide, polymeric material.

4. The thin film-coated polymer web of claim 3, wherein the polymer web has been treated with from 5 to 40 megarads of electron beam radiation having an energy of from 100 keV to 400 keV.

5. The thin film-coated polymer web of claim 4, wherein the polymer web has been treated with an amount of electron beam radiation of from 20 to 40 megarads.

6. The thin film-coated polymer web of claim 4, wherein the polymer web has been treated with an amount of electron beam radiation of about 40 megarads.

7. The thin film-coated polymer web of claim 4, wherein the electron beam radiation has an energy of from about 150 keV to about 250 keV.

8. The thin film-coated polymer web of claim 4, wherein the electron beam radiation has an energy of from about 150 keV to about 175 keV.

9. The thin film-coated polymer web of claim 1, wherein the thin film electronic device is an amorphous silicon photovoltaic semiconductor device.

10. The thin film-coated polymer web of claim 9, wherein the amorphous silicon photovoltaic semiconductor device comprises:
    a) an electrically conductive bottom layer deposited onto the polymer web;
    b) an amorphous silicon photovoltaic structure deposited onto the electrically conductive bottom layer; and
    c) an electrically conductive top layer deposited onto the amorphous silicon photovoltaic structure.

11. The thin film-coated polymer web of claim 10, further comprising a diffusion barrier interposed between the electrically conductive bottom layer and the amorphous silicon photovoltaic structure.

12. The thin film-coated polymer web of claim 10, wherein the amorphous silicon photovoltaic structure comprises:
    a) a first amorphous silicon layer comprising n+ type hydrogenated amorphous silicon;
    b) a second amorphous silicon layer comprising p+ type hydrogenated amorphous silicon; and
    c) a third amorphous silicon layer comprising intrinsic type hydrogenated amorphous silicon interposed between the first and second amorphous silicon layers.

13. The thin film-coated polymer web of claim 10, wherein the electrically conductive top layer is a transparent conducting oxide.

14. A method of making a thin film-coated polymer web, comprising the steps of:
    a) treating an uncoated, cured polymer web with an amount of electron beam radiation sufficient to reduce the amount of low mass residual contaminants that outgas from the surface and body of the polymer web; and b) depositing a thin film electronic device onto the electron beam treated polymer web.

15. The method of claim 14, wherein the polymer web is a flexible polymeric material selected from the group consisting of polyimide, polyester, fluorinated polyester, polyvinyl fluoride, polyvinylide fluoride, polysulphone, aramid, and polytetrafluoroethylene.

16. The method of claim 14, wherein the polymer web is a flexible polyimide polymeric material.

17. The method of claim 16, wherein the polymer web is treated with from about 5 to about 40 megarads of electron beam radiation having an energy of from about 100 keV to about 400 keV.

18. The method of claim 17, wherein the polymer web is treated with an amount of electron beam radiation of from 20 to 40 megarads.

19. The method of claim 17, wherein the polymer web is treated with an amount of electron beam radiation of about 40 megarads.

20. The method of claim 17, wherein the electron beam radiation has an energy of from about 150 keV to about 250 keV.

21. The method of claim 17, wherein the electron beam radiation has an energy of from about 150 keV to about 175 keV.

22. The method of claim 14, wherein the polymer web is treated with electron beam radiation in an inert atmosphere.

23. The method of claim 14, wherein the thin film electronic device is an amorphous silicon photovoltaic semiconductor device.

24. The method of claim 14, wherein the step of depositing the thin film electronic device onto the polymer web comprises the steps of:
   a) depositing an electrically conductive bottom layer onto the polymer web;
   b) depositing an amorphous silicon photovoltaic structure onto the electrically conductive bottom layer; and
   c) depositing an electrically conductive top layer onto the amorphous silicon photovoltaic structure.

25. The method of claim 14, wherein the step of depositing the thin film electronic device onto the polymer web comprises the steps of:
   a) depositing an electrically conductive bottom layer onto the polymer web; and
   b) depositing a diffusion barrier onto the electrically conductive bottom layer;
   c) depositing an amorphous silicon photovoltaic structure onto the diffusion barrier; and
   d) depositing an electrically conductive top layer onto the amorphous silicon photovoltaic structure.

26. The method of claim 24, wherein the step of depositing the amorphous silicon photovoltaic structure onto the electrically conductive bottom layer comprises the steps of:
   a) depositing a first amorphous silicon layer comprising n+ type hydrogenated amorphous silicon onto the electrically conductive metal layer;
   b) depositing a second amorphous silicon layer comprising intrinsic type hydrogenated amorphous silicon onto the first layer of n+type hydrogenated amorphous silicon; and
   c) depositing a third amorphous silicon layer comprising p+ type hydrogenated amorphous silicon onto the second layer of intrinsic type hydrogenated amorphous silicon.

27. The method of claim 24, wherein the step of depositing the amorphous silicon photovoltaic structure onto the electrically conductive metal layer comprises the steps of:
   a) depositing a first amorphous silicon layer comprising p+ type hydrogenated amorphous silicon onto the insulating blocking layer;
   b) depositing a second amorphous silicon layer comprising intrinsic type hydrogenated amorphous silicon onto the first layer of p+type hydrogenated amorphous silicon; and
   c) depositing a third amorphous silicon layer comprising n+ type hydrogenated amorphous silicon onto the second layer of intrinsic type hydrogenated amorphous silicon.

28. The method of claim 24, wherein the electrically conductive top layer is a transparent conducting oxide.

* * * * *

UNITED STATES PATENT AND TRADEMARK OFFICE
CERTIFICATE OF CORRECTION

PATENT NO. : 5,085,939

DATED : February 4, 1992

INVENTOR(S) : Wenz et al.

It is certified that error appears in the above-identified patent and that said Letters Patent is hereby corrected as shown below:

Col. 1, line 23, "b ®" should be --be--.

Col. 3, line 23, "4" should be --14--.

Col. 5, line 44, "H," should be --$H_2$.--.

Col. 8, line 42, "cell A" should be --cell. A--.

Col. 9, line 7, "Table I" should be --Table II--.

Signed and Sealed this

Twenty-ninth Day of June, 1993

Attest:

MICHAEL K. KIRK

*Attesting Officer*     Acting Commissioner of Patents and Trademarks